United States Patent
Lu et al.

(10) Patent No.: US 9,865,777 B2
(45) Date of Patent: Jan. 9, 2018

(54) SEMICONDCUTOR LIGHT-EMITTING DEVICE AND FABRICATING METHOD THEREOF

(71) Applicant: ChipMOS Technologies Inc., Hsinchu (TW)

(72) Inventors: Tung-Bao Lu, Hsinchu (TW); Tzu-Han Hsu, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/336,797

(22) Filed: Oct. 28, 2016

(65) Prior Publication Data

US 2017/0331006 A1 Nov. 16, 2017

(30) Foreign Application Priority Data

May 13, 2016 (TW) .............................. 105114844 A

(51) Int. Cl.
| | | |
|---|---|---|
| H01L 29/06 | (2006.01) | |
| H01L 31/0328 | (2006.01) | |
| H01L 31/0336 | (2006.01) | |
| H01L 31/072 | (2012.01) | |
| H01L 31/109 | (2006.01) | |
| H01L 21/00 | (2006.01) | |
| H01L 33/40 | (2010.01) | |
| H01L 33/06 | (2010.01) | |
| H01L 33/62 | (2010.01) | |

(52) U.S. Cl.
CPC .............. *H01L 33/40* (2013.01); *H01L 33/06* (2013.01); *H01L 33/62* (2013.01); *H01L 2933/0016* (2013.01); *H01L 2933/0066* (2013.01)

(58) Field of Classification Search
CPC ..... H01L 33/12; H01L 33/22; H01L 33/0095; H01L 33/06; H01L 33/40; H01L 33/62
USPC .............................................. 257/13; 438/22
See application file for complete search history.

(56) References Cited

U.S. PATENT DOCUMENTS

| | | | | |
|---|---|---|---|---|
| 2006/0141156 | A1* | 6/2006 | Viel ..................... | C09D 5/4407 427/258 |
| 2009/0015138 | A1* | 1/2009 | Daicho .............. | C09K 11/7734 313/503 |
| 2017/0040490 | A1* | 2/2017 | Lee ........................ | H01L 33/005 |

(Continued)

FOREIGN PATENT DOCUMENTS

| | | |
|---|---|---|
| TW | 201222752 | 6/2012 |
| TW | 201604980 | * 2/2016 |

OTHER PUBLICATIONS

"Office Action of Taiwan Counterpart Application", dated Mar. 14, 2017, p. 1-p. 6, in which the listed references were cited.

*Primary Examiner* — David S Blum
(74) *Attorney, Agent, or Firm* — JCIPRNET

(57) ABSTRACT

A semiconductor light-emitting device including a light-emitting diode chip and an electrode disposed thereon is provided. The electrode at least includes a plated silver alloy ($Ag_{1-x}Y_x$) layer, wherein the Y of the $Ag_{1-x}Y_x$ layer includes metals forming a complete solid solution with Ag at arbitrary weight percentage, and the X of the $Ag_{1-x}Y_x$ layer is in a range from about 0.02 to 0.15. The fabricating method thereof is also provided.

10 Claims, 3 Drawing Sheets

(56) References Cited

U.S. PATENT DOCUMENTS

2017/0077348 A1* 3/2017 Lim ................. H01L 33/44
2017/0179341 A1* 6/2017 Chao ................ H01L 33/22

* cited by examiner

SEMICONDCUTOR LIGHT-EMITTING DEVICE AND FABRICATING METHOD THEREOF

CROSS-REFERENCE TO RELATED APPLICATION

This application claims the priority benefit of Taiwan application serial no. 105114844, filed on May 13, 2016. The entirety of the above-mentioned patent application is hereby incorporated by reference herein and made a part of this specification.

BACKGROUND OF THE INVENTION

Field of the Invention

The invention relates to a semiconductor device and a fabricating method thereof, and particularly relates to a semiconductor light-emitting device and a fabricating method thereof.

Description of Related Art

Light-emitting diodes (LEDs) have advantages such as long lifetime, small volume, high shock-resistance, low heat generation, and low power consumption, etc., and thus are widely applied in various indicators or light sources at home and in various appliances. In recent years, the light-emitting diodes have been developed toward high power, and thus the application field thereof has extended to road lighting, outdoor billboards, traffic lights and other related fields. Apparently, the light-emitting diodes will become a major lighting source with the function of energy saving and environmental protection. The luminous efficiency of the light-emitting diode chip is related to the internal quantum efficiency and the external quantum efficiency (i.e., light extraction efficiency) thereof, wherein the internal quantum efficiency of the light-emitting diode chip is related to the epitaxial quality and the electrode design thereof, while the external quantum efficiency of the light-emitting diode chip is related to the substrate design (e.g., patterned substrate, roughened substrate, etc.) and the secondary optical element design (e.g., reflector, lens, etc.) outside the chip thereof.

The electrode design of the above light-emitting diode chip is used as an example. If the contact resistance between the electrode and the epitaxial layer is too high or the resistance value of the electrode itself is too high, the luminous efficiency (i.e., internal quantum efficiency) of the light-emitting diode chip is low. Additionally, if the contact resistance between the electrode and the solder wire formed in the encapsulation process of the light-emitting diode chip is too high, the luminous efficiency (i.e., internal quantum efficiency) of the light-emitting diode chip is also low. Therefore, the electrode design of the light-emitting diode chip has become one of the key issues to improve the luminous efficiency.

SUMMARY OF THE INVENTION

The invention provides a semiconductor light-emitting device and a fabricating method thereof.

According to an embodiment of the invention, the semiconductor light-emitting device includes a light-emitting diode chip and an electrode disposed on the light-emitting diode chip. The electrode at least includes a plated silver alloy ($Ag_{1-x}Y_x$) layer, wherein the Y of the $Ag_{1-x}Y_x$ layer includes metals forming a complete solid solution with Ag at arbitrary weight percentage, and the X of the $Ag_{1-x}Y_x$ layer is in a range from 0.02 to 0.15.

According to an embodiment of the invention, the Y of the $Ag_{1-x}Y_x$ layer in the electrode includes gold, palladium, or an alloy thereof.

According to an embodiment of the invention, a thickness of the $Ag_{1-x}Y_x$ layer is between 2 micrometers and 8 micrometers.

According to an embodiment of the invention, an average grain size of the $Ag_{1-x}Y_x$ layer is between 0.5 micrometers and 1.5 micrometers.

According to an embodiment of the invention, the electrode not only may include the $Ag_{1-x}Y_x$ layer, but may further include an adhesive layer and a seed layer, wherein the adhesive layer is disposed between the light-emitting diode chip and the $Ag_{1-x}Y_x$ layer, and the seed layer is disposed between the adhesive layer and the $Ag_{1-x}Y_x$ layer.

According to an embodiment of the invention, a material of the adhesive layer includes nickel, titanium, titanium tungsten, palladium, gold, silver, or an alloy thereof, and a thickness of the adhesive layer is between 1000 angstroms and 3000 angstroms; a material of the seed layer includes platinum, silver, or an alloy thereof, and a thickness of the seed layer is between 500 angstroms and 1000 angstroms.

According to an embodiment of the invention, the semiconductor light-emitting device may further include a solder wire or a bump disposed on the $Ag_{1-x}Y_x$ layer, and the solder wire or the bump is used to be electrically connected with the light-emitting diode chip and another element.

The invention also provides a fabricating method of a semiconductor light-emitting device. The fabricating method of the semiconductor light-emitting device includes the following steps. First, a light-emitting diode chip is provided, and a patterned photoresist layer is formed on the light-emitting diode chip, wherein the patterned photoresist layer has an opening, and the opening exposes a surface of the light-emitting diode chip. Then, a plated silver alloy ($Ag_{1-x}Y_x$) layer is formed in the opening by an electroplating process, such that the $Ag_{1-x}Y_x$ layer is located on the light-emitting diode chip and electrically connected with the light-emitting diode chip.

According to an embodiment of the invention, before forming the $Ag_{1-x}Y_x$ layer, an adhesive material layer may be conformally formed on the light-emitting diode chip first, wherein the adhesive material layer covers a surface of the patterned photoresist layer and a bottom of the opening. Then, a seed material layer is conformally formed on the adhesive material layer. Thereafter, a silver alloy material layer is formed on the seed material layer. At last, the patterned photoresist layer is removed to pattern the adhesive material layer, the seed material layer and the silver alloy material layer together.

In the fabricating method provided above, a method of forming the adhesive material layer and the seed material layer includes evaporation, sputtering, electroplating, or electroless plating.

According to an embodiment of the invention, after forming the $Ag_{1-x}Y_x$ layer, a solder wire or a bump may be formed on the $Ag_{1-x}Y_x$ layer to be electrically connected with the light-emitting diode chip and another element.

In at least some of the above embodiments, the $Ag_{1-x}Y_x$ layer of the light-emitting diode chip has good electrical conductivity and thermal conductivity, which are helpful to heat dissipation of the light-emitting diode chip. In some of the above embodiments, the $Ag_{1-x}Y_x$ layer may be used as a wire bonding pad layer to bond with the solder wire, such that an interval between the $Ag_{1-x}Y_x$ layer and the solder wire subsequently formed has good bonding characteristics, thereby improving the contact resistance between the $Ag_{1-x}Y_x$ layer and the solder wire.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
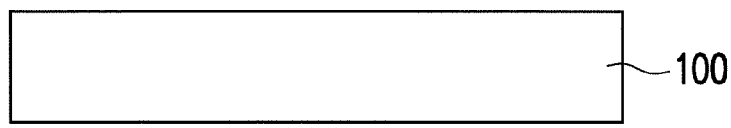
FIG. 1A to FIG. 1D are schematic cross-sectional views of a manufacturing process of a semiconductor light-emitting device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1D are schematic cross-sectional views of a manufacturing process of a semiconductor light-emitting device according to an embodiment of the invention. FIG. 2A and FIG. 2B are schematic cross-sectional views of a light-emitting diode chip according to an embodiment of the invention.

Figure 2A:
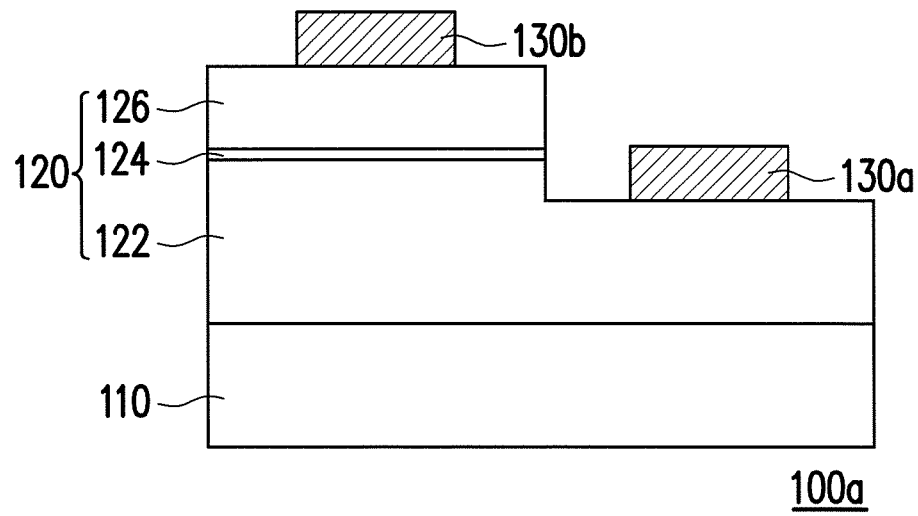
FIG. 2A and FIG. 2B are schematic cross-sectional views of a light-emitting diode chip according to an embodiment of the invention.
Figure 2B:
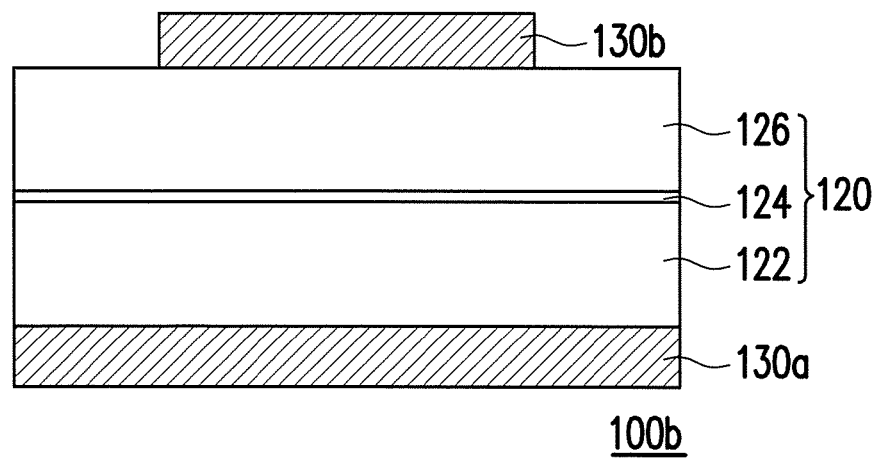

First, referring to FIG. 1A, a light-emitting diode chip 100 is provided. In the embodiment, the light-emitting diode chip 100 is a horizontal type light-emitting diode chip 100a (depicted in FIG. 2A) or a vertical light-emitting diode chip 100b (depicted in FIG. 2B), for example. Here, the horizontal type light-emitting diode chip 100a in FIG. 2A usually includes a substrate 110, an epitaxial laminated layer 120 and a plurality of electrodes 130a and 130b. The substrate 110 is an alumina substrate, a silicon substrate, a silicon nitride substrate, for example. The epitaxial laminated layer 120 is formed on a growth surface of the substrate 110 by a metal organic chemical vapor deposition (MOCVD) process, for example. The electrodes 130a and 130b are located on the epitaxial laminated layer 120 and electrically connected with the epitaxial laminated layer 120. In other words, a good ohmic contact is formed between the electrodes 130a and 130b and the epitaxial laminated layer 120.

As shown in FIG. 2A, the epitaxial laminated layer 120 in the horizontal type light-emitting diode chip 100a includes a first type doped semiconductor layer 122 (e.g., N-type doped semiconductor layer), a quantum well light-emitting layer 124 (e.g., multiple quantum well light-emitting layer) and a second type doped semiconductor layer 126 (e.g., P-type doped semiconductor layer). The electrode 130a is electrically connected with the first type doped semiconductor layer 122, the electrode 130b is electrically connected with the second type doped semiconductor layer 126, and the electrodes 130a and 130b are located at the same side of the epitaxial laminated layer 120. In other words, the substrate 110 and the electrodes 130a and 130b are located at two opposite sides of the epitaxial laminated layer 120 respectively.

The vertical type light-emitting diode chip 100b in FIG. 2B usually includes the epitaxial laminated layer 120 and the plurality of electrodes 130a and 130b. The epitaxial laminated layer 120 is formed by a metal organic chemical vapor deposition (MOCVD) process, for example. The electrodes 130a and 130b are located on two opposite sides of the epitaxial laminated layer 120 and electrically connected with the epitaxial laminated layer 120. In other words, a good ohmic contact is formed between the electrodes 130a and 130b and the epitaxial laminated layer 120.

As shown in FIG. 2B, the epitaxial laminated layer 120 in the vertical type light-emitting diode chip 100b includes the first type doped semiconductor layer 122 (e.g., N-type doped semiconductor layer), the quantum well light-emitting layer 124 (e.g., multiple quantum well light-emitting layer) and the second type doped semiconductor layer 126 (e.g., P-type doped semiconductor layer). The electrode 130a is electrically connected with the first type doped semiconductor layer 122, and the electrode 130b is electrically connected with the second type doped semiconductor layer 126. In other words, the epitaxial laminated layer 120 is located between the electrode 130a and the electrode 130b.

Figure 1B:
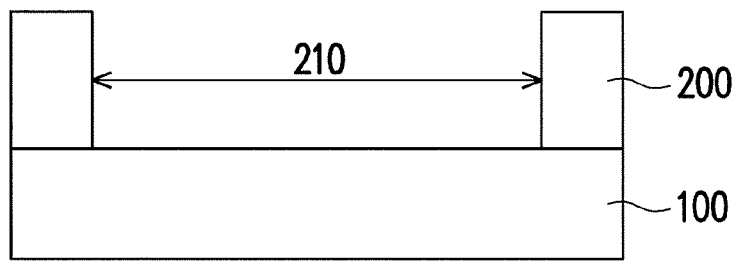

Then, referring to FIG. 1B, a patterned photoresist layer 200 is formed on the light-emitting diode chip 100. In the embodiment, the patterned photoresist layer 200 has at least one opening 210, and the opening 210 exposes a portion of a surface of the light-emitting diode chip 100. The patterned photoresist layer 200 has a preset pattern, and the preset pattern defines the position where the electrode is desired to be formed. In other words, the position of the opening 210 of the patterned photoresist layer 200 corresponds to the position where the electrode is desired to be formed.

Figure 1C:
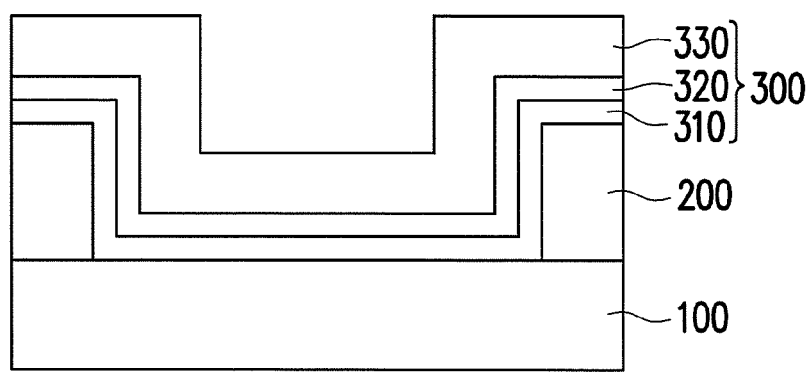

Thereafter, referring to FIG. 1C, after the fabrication of the patterned photoresist layer 200 is completed, the patterned photoresist layer 200 is used as a mask, and the fabrication of an electrode material layer 300 is performed on the light-emitting diode chip 100. In an embodiment, the fabrication of the electrode material layer 300 includes the fabrication of an adhesive material layer 310, a seed material layer 320 and a silver alloy material layer 330. The adhesive material layer 310 and the seed material layer 320 are sequentially and conformally formed on a partial region of the light-emitting diode chip 100 and the patterned photoresist layer 200 by the method of evaporation, sputtering, or plating (including electro-plating driven by voltage bias or electroless plating driven by oxidation-reduction reaction), for example. The silver alloy material layer 330 is conformally formed on the seed material layer 320 by electroplating, for example.

In the embodiment, the adhesive material layer 310 includes nickel, titanium, titanium tungsten, palladium, gold, silver, or an alloy thereof, and a thickness thereof is between 1000 angstroms and 3000 angstroms; the seed material layer 320 includes platinum, silver, or an alloy thereof, and a thickness thereof is between 500 angstroms and 1000 angstroms; the silver alloy material layer ($Ag_{1-x}Y_x$) 330 includes silver and metal Y, and a thickness thereof is between 2 micrometers and 8 micrometers. Additionally, the metal Y (e.g., gold, palladium, or an alloy thereof) of the silver alloy material layer ($Ag_{1-x}Y_x$) 330 forms a complete solid solution with Ag at arbitrary weight percentage, and the X is in a range from 0.02 to 0.15. Since the silver alloy material layer 330 is formed by the method of electroplating, an average grain size of the silver alloy material layer 330 formed by the method of electroplating is larger compared with that formed by other film formation method. In the embodiment, the average grain size of the silver alloy material layer 330 formed by the method of electroplating is between 0.5 micrometers and 1.5 micrometers.

Figure 1D:
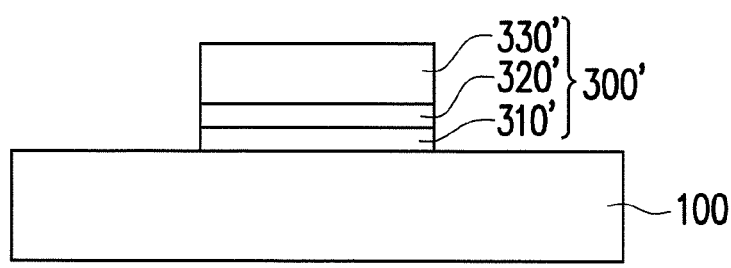

Referring to FIG. 1C and FIG. 1D, after the fabrication of the electrode material layer 300 is completed, the electrode material layer 300 is patterned so as to form an electrode 300' on the light-emitting diode chip 100, and the position of the electrode 300' corresponds to the position of the opening 210. In the embodiment, the electrode material layer 300 may be patterned by removing the patterned photoresist layer 200 to achieve. In particular, in the process of removing the patterned photoresist layer 200, a portion of the electrode material layer 300 formed on the patterned photoresist layer 200 is removed with the patterned photoresist layer 200 together. In other words, the patterned photoresist layer 200 and a portion of the electrode material layer 300 thereon are stripped together from the light-emitting diode chip 100 to form the electrode 300'.

In the embodiment, the electrode 300' after patterning includes an adhesive layer 310', a seed layer 320' and a plated silver alloy layer 330', wherein the adhesive layer 310' is located between the light-emitting diode chip 100 and the plated silver alloy layer 330', and the seed layer 320' is located between the adhesive layer 310' and the plated silver alloy layer 330'. The material and the thickness of the adhesive layer 310' are the same as that of the adhesive material layer 310. The material and the thickness of the seed layer 320' are the same as that of the seed material layer 320. The material and the thickness of the plated silver alloy layer 330' are the same as that of the silver alloy material layer ($Ag_{1-x}Y_x$) 330. Similarly, since the plated silver alloy layer 330' is formed by the method of electroplating and after the patterning process, an average grain size of the plated silver alloy layer 330' is larger. In the embodiment, the average grain size of the plated silver alloy layer 330' is between 0.5 micrometers and 1.5 micrometers.

Furthermore, the electrode 300' shown in FIG. 1D may be used in the electrode 130a and the electrode 130b in FIG. 2A and the electrode 130b in FIG. 2B.

Figure 3A:
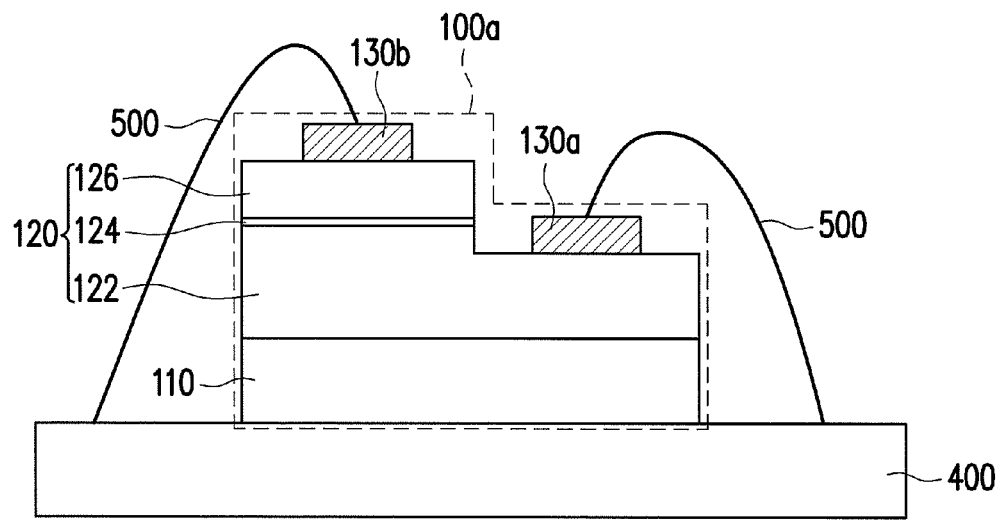
FIG. 3A is a schematic view of an electrical connection between the light-emitting diode chip and the carrier in FIG. 2A.
Figure 3B:
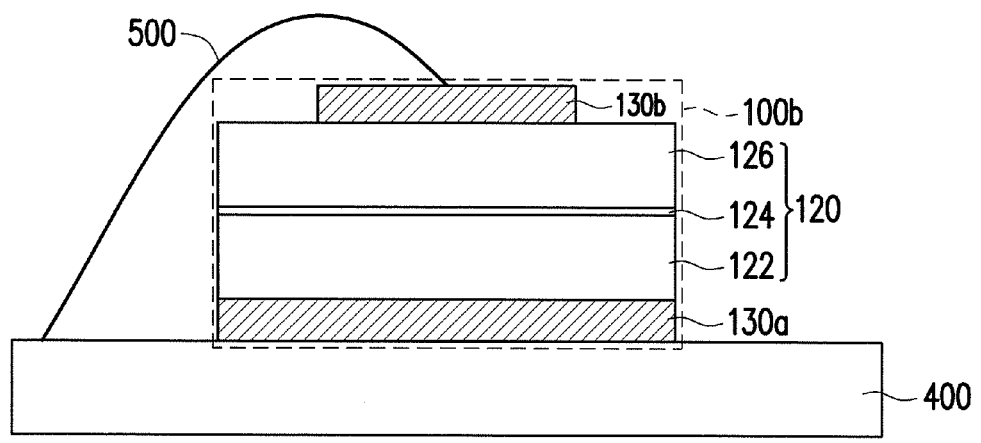
FIG. 3B is a schematic view of an electrical connection between the light-emitting diode chip and the carrier in FIG. 2B.

FIG. 3A is a schematic view of an electrical connection between the light-emitting diode chip and the carrier in FIG. 2A. FIG. 3B is a schematic view of an electrical connection between the light-emitting diode chip and the carrier in FIG. 2B. Referring to FIG. 3A and FIG. 3B, after the fabrication of the electrode 130a and the electrode 130b is completed, the light-emitting diode chip 100a in FIG. 2A or the light-emitting diode chip 100b in FIG. 2B of the embodiment may be disposed on another element 400 (e.g., a circuit board), and the electrode 130a and the electrode 130b may be electrically connected with the element 400 by a solder wire 500 or a bump (not shown).

In at least some of the above embodiments, the plated silver alloy layer in the light-emitting diode chip has good electrical conductivity and thermal conductivity, which are helpful to heat dissipation of the light-emitting diode chip. Additionally, in some of the above embodiments, the plated silver alloy layer and the solder wire has good bonding characteristics therebetween. Accordingly, the plated silver alloy layer in the light-emitting diode chip of the disclosure is helpful to improve the contact resistance between the plated silver alloy layer and the solder wire, thereby enhancing the luminous efficiency of the light-emitting diode chip.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor light-emitting device, comprising:
   a light-emitting diode chip; and
   an electrode, disposed on the light-emitting diode chip, the electrode at least comprising:
   a plated silver alloy ($Ag_{1-x}Y_x$) layer, wherein the Y of the $Ag_{1-x}Y_x$ layer comprises metals forming a complete solid solution with Ag at predetermined weight percentage, and the X of the $Ag_{1-x}Y_x$ layer is in a range from 0.02 to 0.15;
   an adhesive layer, disposed between the light-emitting diode chip and the Ag1-xYx layer; and
   a seed layer, disposed between the adhesive layer and the Ag1-xYx layer.

2. The semiconductor light-emitting device according to claim 1, wherein the Y of the $Ag_{1-x}Y_x$ layer comprises gold, palladium, or an alloy thereof.

3. The semiconductor light-emitting device according to claim 1, wherein a thickness of the $Ag_{1-x}Y_x$ layer is between 2 micrometers and 8 micrometers.

4. The semiconductor light-emitting device according to claim 1, wherein an average grain size of the $Ag_{1-x}Y_x$ layer is between 0.5 micrometers and 1.5 micrometers.

5. The semiconductor light-emitting device according to claim 1, wherein a material of the adhesive layer comprises nickel, titanium, titanium tungsten, palladium, gold, silver, or an alloy thereof, and a thickness of the adhesive layer is between 1000 angstroms and 3000 angstroms; a material of the seed layer comprises platinum, silver, or an alloy thereof, and a thickness of the seed layer is between 500 angstroms and 1000 angstroms.

6. The semiconductor light-emitting device according to claim 1, further comprising:
   a solder wire or a bump, disposed on the $Ag_{1-x}Y_x$ layer to be electrically connected with the light-emitting diode chip and another element.

7. A fabricating method of a semiconductor light-emitting device, comprising:
   providing a light-emitting diode chip;
   forming a patterned photoresist layer on the light-emitting diode chip, the patterned photoresist layer having an opening, the opening exposing a surface of the light-emitting diode chip; and
   forming a plated silver alloy ($Ag_{1-x}Y_x$) layer in the opening by an electroplating process, wherein the Y of the $Ag_{1-x}Y_x$ layer comprises metals forming a complete solid solution with Ag at predetermined weight percentage and the X of the Ag1-xYx layer is in a range from 0.02 to 0.15, such that the $Ag_{1-x}Y_x$ layer is located on the light-emitting diode chip and electrically connected with the light-emitting diode chip.

8. The fabricating method of the semiconductor light-emitting device according to claim 7, before forming the $Ag_{1-x}Y_x$ layer, further comprising:
   conformally forming an adhesive material layer on the light-emitting diode chip, the adhesive material layer covering a surface of the patterned photoresist layer and a bottom of the opening;

conformally forming a seed material layer on the adhesive material layer;

forming a silver alloy material layer on the seed material layer; and removing the patterned photoresist layer to pattern the adhesive material layer, the seed material layer and the silver alloy material layer together.

9. The fabricating method of the semiconductor light-emitting device according to claim 8, wherein a method of forming the adhesive material layer and the seed material layer comprises evaporation, sputtering, or plating.

10. The fabricating method of the semiconductor light-emitting device according to claim 7, after forming the $Ag_{1-x}Y_x$ layer, further comprising forming a solder wire or a bump on the $Ag_{1-x}Y_x$ layer to be electrically connected with the light-emitting diode chip and another element.

* * * * *